(12) United States Patent
Linder

(10) Patent No.: US 6,717,450 B1
(45) Date of Patent: Apr. 6, 2004

(54) MONOLITHIC I-LOAD ARCHITECTURE FOR AUTOMATIC TEST EQUIPMENT

(75) Inventor: Lloyd F. Linder, Agoura Hills, CA (US)

(73) Assignee: TelASIC Communications, Inc., El Segundo, CA (US)

( * ) Notice: Subject to any disclaimer, the term of this patent is extended or adjusted under 35 U.S.C. 154(b) by 107 days.

(21) Appl. No.: 10/144,175

(22) Filed: May 13, 2002

(51) Int. Cl.[7] .................................................. H03K 5/08
(52) U.S. Cl. ....................................................... 327/321
(58) Field of Search ................................. 327/309, 318, 327/319, 320, 321, 325, 330, 587, 588

(56) References Cited

U.S. PATENT DOCUMENTS

| | | |
|---|---|---|
| 5,010,297 A | 4/1991 | Babcock |
| 5,350,952 A | 9/1994 | Cheng et al. |
| 5,745,003 A * | 4/1998 | Wakimoto et al. .......... 327/382 |
| 6,157,224 A | 12/2000 | Linder |
| 6,211,723 B1 * | 4/2001 | Creek .......................... 327/494 |

* cited by examiner

*Primary Examiner*—Jeffrey Zweizig
(74) *Attorney, Agent, or Firm*—Morrison & Foerster LLP

(57) ABSTRACT

An active load circuit for automatic test equipment that tests integrated circuits. The active load circuit includes a current source; a current sink; a current switching switching circuit having current source and current sink nodes respectively connected to the current source and the current sink; and a control circuit for controlling the current switching circuit with a differential voltage that is limited in amplitude and of the same polarity as a voltage difference between a fixed reference voltage and a pin output voltage of a device under test.

12 Claims, 3 Drawing Sheets

MONOLITHIC I-LOAD ARCHITECTURE FOR AUTOMATIC TEST EQUIPMENT

BACKGROUND OF THE INVENTION

The disclosed invention relates generally to automatic test equipment (ATE) used for automated production line testing of multi-pin integrated circuits, and particularly to active load circuits employed in such test equipment. An active load circuit is connected to a pin that is being monitored for response to test signals applied to other pins of the integrated circuit device under test (DUT).

Automatic test equipment for automated testing of integrated circuits typically employ a large number of "pin cards" that include circuitry for connection to a corresponding pin of an integrated circuit device under test. Each pin card includes a pin driver circuit that supplies a test signal to the associated pin, and an active load circuit that sources or sinks a current depending upon the output voltage of the pin. The pin driver and the active circuit are switchably connectable to a corresponding pin of the device under test, such that the pin is connected to either the pin driver or the active load at any given time. For reference, an active load can be considered as being in the ACTIVE mode when it is connected to the pin, and in the INHIBIT mode when it is disconnected from the pin.

The circuitry employed to switch a pin between the active load and the pin driver commonly includes Schottky diodes arranged in a bridge. One or more of the Schottky diodes is subjected to relatively large levels of reverse bias as the output voltage on a pin swings over a typical range such as −2 to 7 volts. The large reverse bias can cause leakage currents as well as degradation of the forward action characteristics. To the extent that the leakage currents are directly connected to the pin, the leakage currents must be extremely low in the INHIBIT mode, but can be acceptable in the ACTIVE mode so long as the leakage does not affect the functionality of the active load circuit.

In high speed applications, the leakage and/or reliability of Schottky diodes that are on-chip with the active load circuit can be unacceptable. This has required the Schottky diodes to be a separate integrated circuit which is ineffecient and more costly.

SUMMARY OF THE DISCLOSURE

An active load circuit is described that includes a current source; a current sink; a current switching switching circuit having current source and current sink nodes respectively connected to the current source and the current sink; and a control circuit for controlling the current switching circuit with a differential voltage that is limited in amplitude and of the same polarity as the difference between a fixed reference voltage and a pin output voltage of a device under test.

BRIEF DESCRIPTION OF THE DRAWINGS

These and other features and advantages of the present invention will become more apparent from the following detailed description, as illustrated in the accompanying drawings, in which.

DETAILED DESCRIPTION OF THE DISCLOSURE

Figure 1:
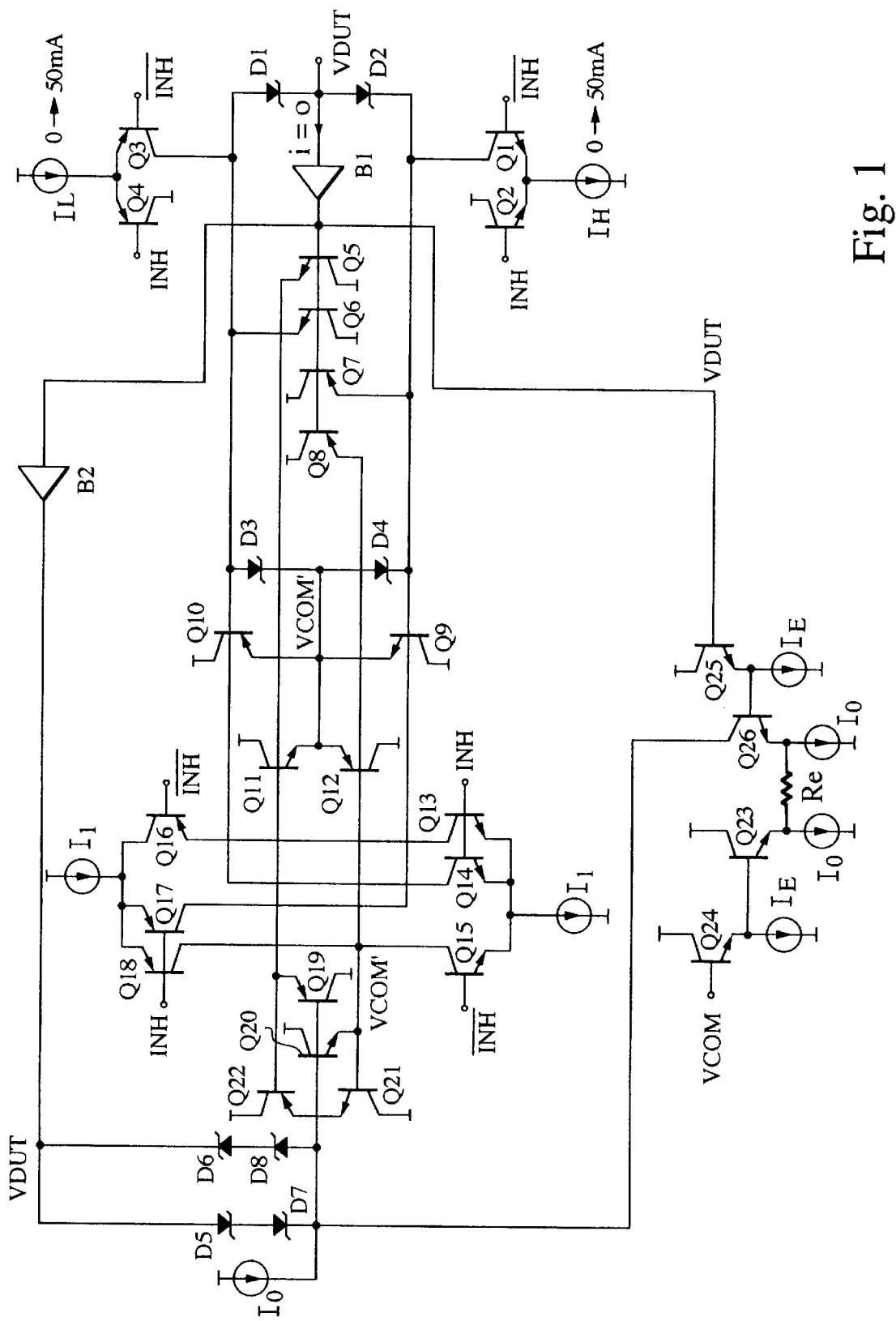
FIG. 1 is a schematic diagram of an active load circuit that employs the invention.

FIG. 1 illustrates an active load circuit that includes a Schottky diode ring or bridge formed of diodes D1–D4. In the ACTIVE mode, a differential switch pair of NPN transistors (Q1, Q2) and a differential switch pair of PNP transistors (Q3, Q4) provide programmable currents $I_L$ and $I_H$ to the Schottky diode bridge which selectively switches such currents into or out of the associated pin of the device under test. The node between the Schottky diodes D1, D2 is connected to the device pin which provides a pin output voltage VDUT. Each of the switch pairs (Q1, Q2), (Q3, Q4) is controlled by differential inhibit mode control signals INH' and INH, and each of the currents $I_L$ and $I_H$ can be in the order of 0–50 mA. A buffer B1 having zero input bias current (indicated in the drawing by i=0) provides a buffered version of the pin output voltage VDUT to the base terminals of NPN transistors Q5, Q6 and the base terminals of PNP transistors Q7, Q8. The buffer B1 limits leakage current when the active load circuit is in the INHIBIT mode.

NPN transistors Q13, 014 provide current from a current source $I_1$ to NPN transistors Q5 and Q6, while PNP transistors Q17 and Q18 provide current from a current source $I_1$ to PNP transistors Q7 and Q8. The transistors Q13, Q14, Q17, Q18 receive the inhibit control signal INH at their base terminals, and in the ACTIVE mode (i.e., INH and INH' are inactive and active, respectively), are off, such that the transistors Q5–Q8 are resultantly off in the ACTIVE mode. Also, this action causes NPN transistor Q9, PNP transistor Q10, NPN transistor Q21, and PNP transistor Q22 to be off in the ACTIVE mode. PNP transistor Q16 and NPN transistor Q15 receive the inverted inhibit mode control signal INH' at their base terminals, and thus are on in the ACTIVE mode, thereby supplying current to a PNP transistor Q19 and an NPN transistor Q20. In the ACTIVE mode, the transistors Q19, Q20, Q11, and Q12, form a complementary class AB unity gain buffer that provides a buffered version of VCOM' to drive the Schottky diode bridge. As described further herein, VCOM' is a voltage that tracks the magnitude of the pin output voltage VDUT relative to a fixed reference voltage VCOM in such a manner that (VDUT−VCOM') is limited in amplitude and is of the same polarity as (VDUT−VCOM). VCOM' does not have the same value as VCOM in voltage, but must be able to sink and source the load currents $I_H$ and $I_L$ in the range of 0–50 mA at the transistors Q11 and Q12.

This architecture is to provide a low reverse bias for the Schottky diode bridge in both ACTIVE and INHIBIT modes. For the ACTIVE mode, an additional circuit comprised of NPN transistors Q23–Q26, a resistor RE, Schottky diodes D5–D8, current sources $I_O$ and $I_E$, and a buffer B2 provides VCOM'. The buffer B2 provides a buffered version of the pin output voltage VDUT voltage that serves as a reference for VCOM'. The additional circuit allows VCOM' and the Schottky diode bridge to track VDUT, which prevents the Schottky diode bridge from experiencing large voltage excursions.

In the ACTIVE mode, when VDUT is substantially equal to VCOM, the differentially coupled pair of transistors Q23, Q26 is balanced, and the voltage VCOM' presented to the Schottky diode bridge is substantially equal to VDUT. As VDUT increases relative to VCOM, VCOM' decreases non-linearly as a function of VDUT, and will clamp two Schottky diode drops below VDUT, while VDUT is greater than VCOM. Thus, the voltage applied to the Schottky diode bridge will be on the order of one Schotkky diode drop $V_D$, which will be the worst case reverse bias, as opposed to (9-$V_D$) volts in known active load circuits. As VDUT goes below VCOM, VCOM' will increase to a maximum of two Schottky diode drops above VDUT, which will provide a Schottky diode worst case reverse bias. This circuitry is provided to assure that the Schottky diodes in the bridge don't get overstressed. The complexity is made difficult by the fact that no matter whether VDUT greater than or less than VCOM, it would be advantageous for VCOM' to track VDUT, so that the voltage drops across the Schottky bridge for the off diodes are kept low.

Effectively, the transistors Q23–Q26 and the associated current sources compare the pin output voltage VDUT to the reference voltage VCOM. When VDUT goes above or below VCOM, the Schottky diodes (D5, D7) or (D6, D8) turn on, and provide a voltage that tracks, or is bootstrapped to, VDUT so that the Schottky diode bridge (D1–D4) is protected from breakdown in the ACTIVE mode. The resistor RE is included in the differential pair Q23, Q26 and is sufficiently large so that the differential pair operates in a linear region and never fully switches. In this manner, the transistors Q23, Q26 do not experience reverse base emitter voltages that exceed the reverse base emitter breakdown voltage.

In summary, in the ACTIVE mode VCOM' tracks VDUT as follows:
VDUT VCOM'
=VCOM~VDUT
<VCOM VDUT+2$V_D$
>VCOM VDUT−2$V_D$ In the INHIBIT mode, the inhibit mode control signals (INH, INH') are active and inactive, respectively, and transistors Q2, Q4, Q13, Q14, Q17, Q18 are on, while transistors Q1, Q3, Q15, Q16 are off. The current to the Schottky bridge is accordingly turned off. The currents in transistors Q13, Q14, Q17, and Q18 turn on the transistors Q5, Q6, Q7, and Q8, respectively. These devices turning on turn on the transistors Q9, Q10, Q21, and Q22. The transistors Q6, Q7, Q9 and Q10 comprise a class AB buffer that bootstraps VCOM' and the top and bottom of the Schottky bridge to VDUT with unity gain. Thus, in the INHIBIT mode, as VDUT swings +7 to −2 volts (worst case), each of the Schottky diodes D1–D4 is bootstrapped and reverse-biased, by one base-emitter diode drop, relative to the VDUT voltage.

Further in the INHIBIT mode, in order to avoid damaging the transistors Q19, Q20, Q11, Q12 that comprise the VCOM' buffer by an excessively large base-emitter reverse-bias, the VCOM' buffer is also shut off and reverse-biased through the action of Q21, Q22, Q5, Q8 which comprise a class AB buffer. Thus, the worst case reverse bias is one base-emitter voltage. The diodes (D5, D7) and (D6, D8) will resultantly have zero bias across them and are bootstrapped relative to VDUT in the INHIBIT mode. In the INHIBIT mode Q21, Q22 will absorb the current $I_O$, as well as the signal current out of the collector of Q26. If it is determined that this signal current is a problem, the Q23–Q26 circuitry can be inhibited in the INHIBIT mode. In addition, it is possible that the diodes D7 and D8 can be replaced by resistors, or a Schottky diode and resistor network.

An advantage of the architecture of FIG. 1 is that the Schottky diode bridge never experiences large voltage excursions, relative to VDUT, in either the ACTIVE or INHIBIT modes. A significant portion of the circuitry of FIG. 1 is included as a precaution to insure that there are no large signal swings in the Schottky diode bridge or the VCOM' buffer in the INHIBIT mode. It is possible that through bootstrapping action such circuitry is not required, and can be omitted to provide the active load circuit of FIG. 2. In this circuit, in the INHIBIT mode, the VCOM buffer (transistors Q19, Q20, Q11, Q12) is bootstrapped to VDUT, above it by 2 Schottky diodes, or below it by 2 Schottky diode drops. Q1 and Q3 are off, and Q2 and Q4 are on, and the programmable currents $I_H$ and $I_L$ flow through these transistors. The Schottky diode bridge is off in the INHIBIT mode and there will be a worst case voltage difference of two Schottky diodes between the VDUT node and the buffered VCOM' node.

Since in either of the D1, D3 leg or the D2, D4 leg, one Schottky diode would be forward-biased, and the other diode would be reverse-biased, if a leg is conducting current, the reverse-biased diode would have to breakdown in order for current to flow. However, since a small bias is maintained across the bridge (2 Schottky diode drops), the bridge will not turn on, and the resultant leakage current in the INHIBIT mode will be small.

Figure 2:
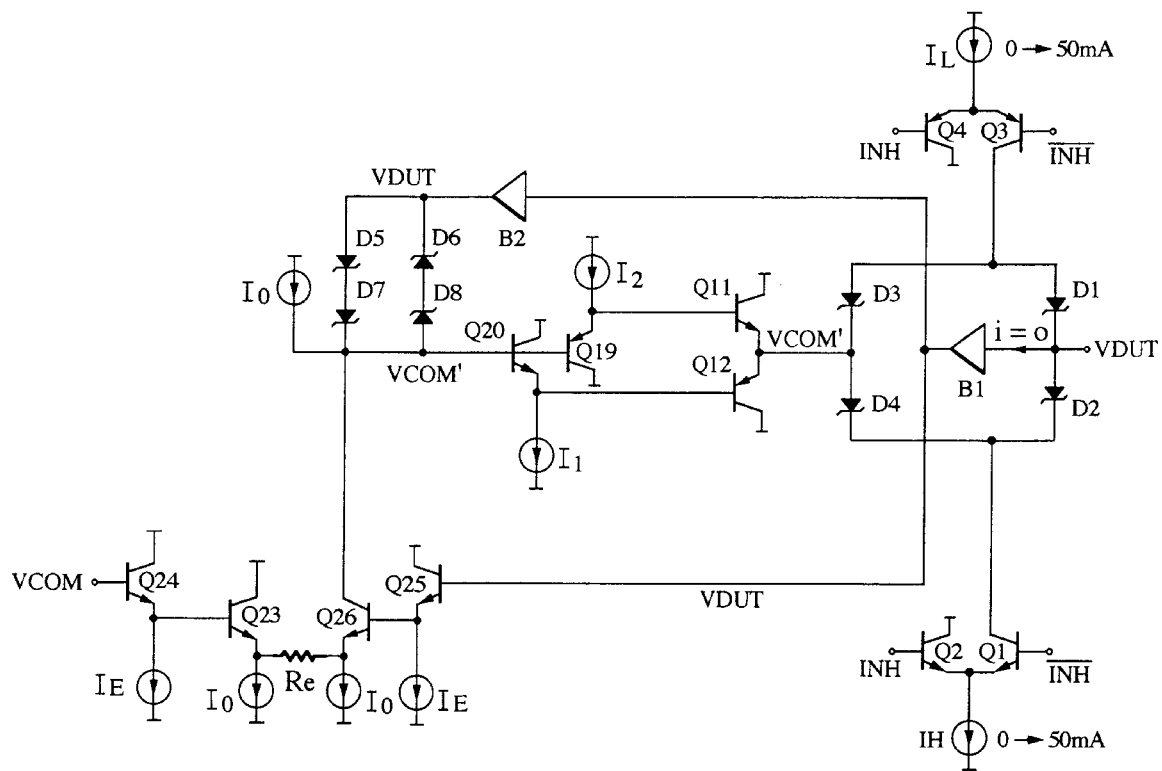
FIG. 2 is a schematic diagram of another active load circuit that employs the invention.

The active load circuit of FIG. 2 basically comprises the ACTIVE mode circuitry of the active load circuit of FIG. 1 but wherein INHIBIT is accomplished by shutting off the Schottky diode bridge currents only. The active load circuit of FIG. 1 is a more conservative implementation, and considerations in determining whether to implement the active load circuit of FIG. 1 or FIG. 2 can include INHIBIT mode leakage, speed, settling, and/or power requirements.

Figure 3:
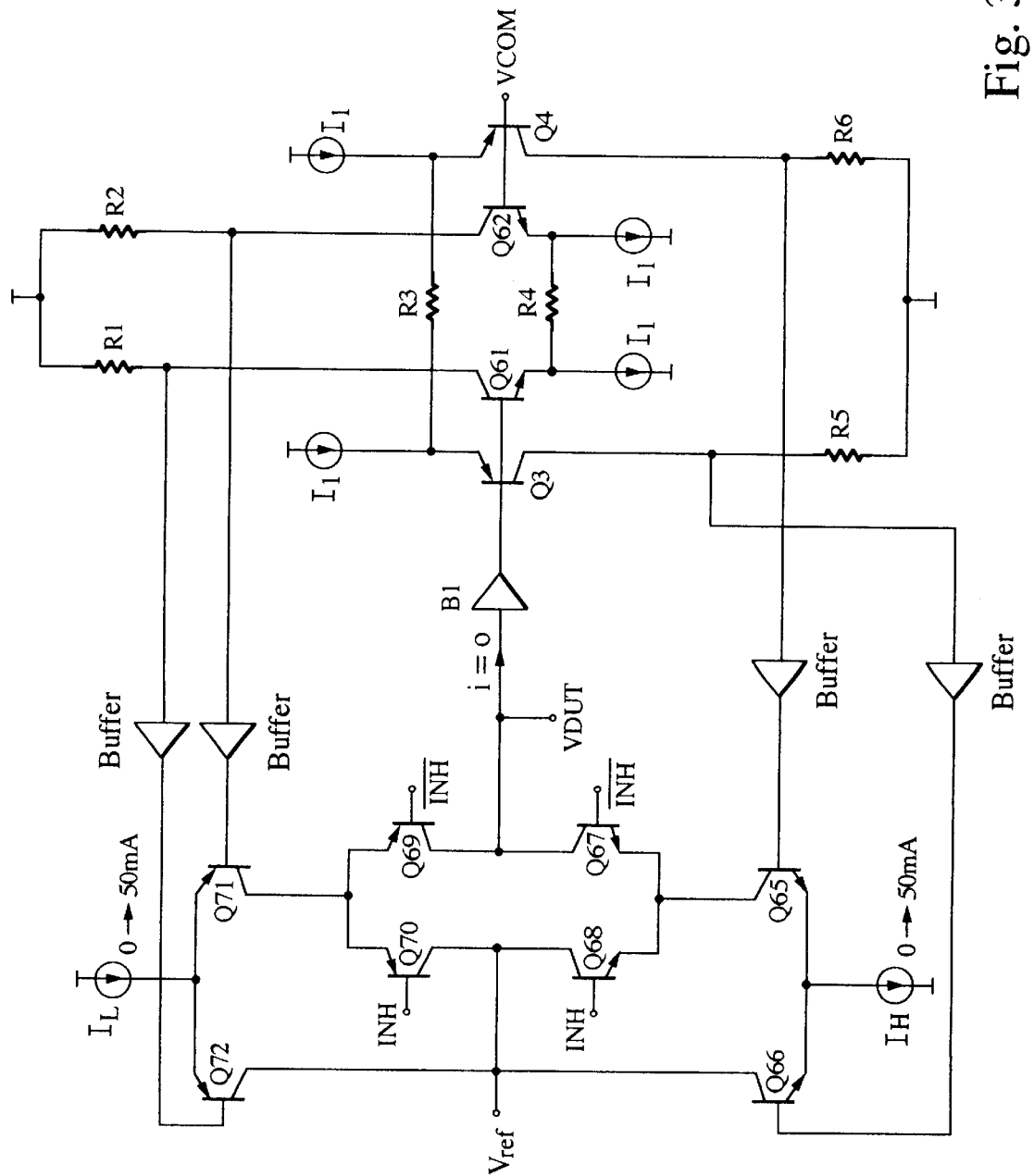
FIG. 3 is a schematic diagram of a further active load circuit that employs the invention.

Referring now to FIG. 3, schematically depicted therein is a complementary bipolar only active load circuit that avoids the use of Schottky diodes, for example to avoid leakages associated with parasitic devices in a Schottky diode. Also, the reverse-bias stress that can be applied to a Schottky diode may be too low for a particular application, or the reverse-bias leakage current of the schottky diode may be unacceptably high for the INHIBIT mode. The pin output voltage VDUT and the fixed reference voltage VCOM are the same voltages as in FIGS. 1 and 2. As with the Schottky diode implementations, the voltage difference between VCOM and VDUT can be as large as 9 volts. The circuitry comprised of a differentially coupled NPN transistor switch pair (Q61, Q62), a differentially coupled PNP transistor switch pair (Q63, Q64), resistors R1–R6, and current sources $I_{11}$ reduces and level shifts the voltage difference between VDUT and VCOM through attenuation of the signal swing to drive a differential NPN transistor switch pair (Q65, Q66) and a differential PNP transistor switch pair (Q71, Q72) via suitable buffers. More particularly, transistors Q61–Q64 attenuate the large swing on VDUT by having a gain that is less than 1, such that the differential NPN transistor switch pair (Q65, Q66) and the differential PNP transistor switch pair (Q71, Q72) are driven with a version of the voltage difference between VDUT and VCOM having a reduced or attenuated voltage swing as compared to the voltage swing of the voltage difference between VDUT and VCOM. This can also be accomplished by a resistive attenuator before the differential switch pairs.

This reduced voltage swing protects the switch pairs (Q65, Q66) and (Q71, Q72) from reverse-bias leakage and stress, and reliability problems. The active load circuit of FIG. 3 also includes a zero input current buffer B1 at the VDUT pin so that the leakage is low in the INHIBIT mode. It should be noted that VCOM no longer has to source and sink the $I_H$ and $I_L$ currents. This is now accomplished by the VREF function in this architecture. The switch pairs (Q65, Q66) and (Q71, Q72) will switch $I_L$ or $I_H$, depending on the value of VDUT, into or out of the pin, respectively. Differential switch pairs (Q67, Q68) and (Q69, Q70) receive differential inhibit control mode signals (INH, INH') and function to isolate the $I_H$ and $I_L$ currents from VDUT during the INHIBIT mode.

In this architecture, in the INHIBIT mode, VDUT will still be switching, worst case, and the collector-base breakdown of the transistors Q67 and Q69 must be greater than 10V, with the resulting leakage currents on the order of zero amps. If for a given complementary bipolar process the voltage swing exceeds the collector-base breakdown voltage, this can be addressed by bootstrapping the differential signals INH and INH' to VDUT. This bootstrapped signal is an attenuated version of VDUT which will not only protect the differential switch pairs (Q67, Q68) and (Q69, Q70), but also the transistors Q65, Q66, Q71, Q72.

It should be noted that some complementary bipolar processes also have p-channel JFET devices available. These devices could possibly be used in the buffer off of the VDUT node if they are fast enough, and have low enough levels of gate leakage over the specified voltage range. It should also be pointed out that the switching circuitry is always active, even in INHIBIT mode, so that the transition from INHIBIT mode to ACTIVE mode should be fairly fast.

Not shown in the schematic are the driver circuits for the switch pairs (Q65, 066) and (Q71, Q72). For example, a PNP switch pair will drive switch pair (Q67, Q68) as is the case for (Q63, Q64) driving (Q65, Q66). Also, an NPN switch pair will drive (Q69, Q70) as is the case for (Q61, Q62) driving (Q71, Q72). If the devices are sized properly, the current responses will be symmetrical. Thus, this architecture provides the same functionality as the Schottky bridge implementation without the use of Schottky diodes.

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. An active load circuit comprising:

a current source;

a current sink;

a current switching diode bridge including a plurality of Schottky diodes, an input node for receiving an output voltage of a pin of a device under test, a reference node for receiving a buffered reference voltage, and current source and current sink nodes respectively connected to said current source and said current sink;

a pin output voltage buffer having an input for receiving said pin output voltage and an output for providing a buffered pin output voltage;

a reference circuit responsive to a fixed reference voltage and said buffered pin output voltage for providing a controlled reference voltage which tracks said buffered pin output voltage so as to be two Schottky diode voltage drops less than said buffered pin output voltage when said buffered pin output voltage is greater than said fixed reference, and two Schottky diode voltage drops greater than said buffered pin output voltage when said buffered pin output voltage is less than said fixed reference; and a reference voltage buffer receiving said controlled reference voltage at a buffer input and for providing said buffered reference voltage.

2. The active load circuit of claim 1 wherein said reference circuit comprises:

a clamping circuit for clamping said reference voltage buffer input to said pin output voltage; and a differential circuit connected to said reference voltage buffer input and responsive to said buffered pin output voltage and said fixed reference voltage.

3. The active load circuit of claim 2 wherein said clamping circuit includes serially connected Schottky diodes.

4. The active load circuit of claim 2 further including bootstrapping circuitry for bootstrapping said Schottky diodes of said switching diode bridge to said pin output voltage when the active load circuit is in an INHIBIT mode.

5. The active load circuit of claim 2 further including switching circuitry for selectively disabling said reference voltage buffer when the active load circuit is in an INHIBIT mode.

6. The active load circuit of claim 2 wherein said reference voltage buffer comprises a class AB amplifier that provides a bootstrapped version of said pin output voltage as said buffered reference voltage when the active load circuit is in an INHIBIT mode.

7. An active load circuit comprising:

a switched current source;

a switched current sink;

a current switching diode bridge including a plurality of Schottky diodes, an input node for receiving an output voltage of a pin of a device under test, a reference node for receiving a buffered reference voltage, and current source and current sink nodes respectively connected to said switched current source and said switched current sink;

a pin output voltage buffer having an input for receiving said pin output voltage and an output for providing a buffered pin output voltage;

a reference circuit responsive to a fixed reference voltage and said buffered pin output voltage for providing a controlled reference voltage which tracks said buffered pin output voltage so as to be of the same polarity as a voltage difference between said fixed reference voltage and said buffered pin output voltage but of less amplitude than said difference voltage; and a reference voltage buffer receiving said controlled reference voltage at a buffer input and for providing said buffered reference voltage.

8. An active load circuit comprising:

a current source;

a current sink;

a current switching circuit including bipolar transistors and responsive to a voltage difference signal indicative of a difference between reference voltage and a pin output voltage of a pin of a device under test, and current source and current sink nodes respectively connected to said current source and said current sink;

a pin voltage buffer having an input for receiving said pin output voltage and an output for providing a buffered pin output voltage; and level shifting circuitry responsive to said reference voltage and said buffered pin output voltage for providing as said voltage difference signal an attenuated version of a voltage difference between said reference voltage and said buffered pin output voltage.

9. The active load circuit of claim 8 wherein:

said switching circuit includes a first differential switch pair of PNP transistors connected to said current source and a first differential switch pair of NPN transistors connected to said current sink.

10. The active load circuit of claim 9 wherein:

said level shifting circuitry includes (a) a second differential switch pair of NPN transistors responsive to said buffered pin output voltage and said reference voltage for providing inputs to said first differential switch pair of PNP transistors, and (b) a second differential switch pair of PNP transistors responsive to said buffered pin output voltage and said reference voltage for providing inputs to said first differential switch pair of PNP transistors.

11. An active load circuit comprising:

a current source;

a current sink;

a current switching circuit responsive to a voltage difference signal indicative of a difference between a reference voltage and a pin output voltage of a pin of a device under test, and current source and current sink nodes respectively connected to said current source and said current sink; and a voltage difference controlling circuit responsive to said reference voltage and said pin output voltage for providing as said voltage difference signal an attenuated version of a voltage difference between said reference voltage and said pin output voltage.

12. An active load circuit comprising:

a current source;

a current sink;

a current switching circuit having current source and current sink nodes respectively connected to said current source and said current sink; and a reference circuit for controlling said current switching circuit with a differential voltage that is limited in amplitude and of the same polarity as a voltage difference between a fixed reference voltage and a pin output voltage of a device under test.

* * * * *